US011277113B2

(12) United States Patent
Park et al.

(10) Patent No.: US 11,277,113 B2
(45) Date of Patent: Mar. 15, 2022

(54) BULK-ACOUSTIC WAVE RESONATOR (71) Applicant: Samsung Electro-Mechanics Co., Ltd., Suwon-si (KR)

(72) Inventors: Seung Wook Park, Suwon-si (KR); Jae Hyun Jung, Suwon-si (KR); Jae Chang Lee, Suwon-si (KR); Dae Hun Jeong, Suwon-si (KR); Sang Uk Son, Suwon-si (KR); Seong Hun Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/936,807

(22) Filed: Jul. 23, 2020

(65) Prior Publication Data

US 2021/0313954 A1 Oct. 7, 2021

(30) Foreign Application Priority Data

Apr. 7, 2020 (KR) .................. 10-2020-0042080

(51) Int. Cl.
*H03H 9/13* (2006.01)
*H03H 9/02* (2006.01)
*H03H 9/17* (2006.01)

(52) U.S. Cl.
CPC ........ *H03H 9/131* (2013.01); *H03H 9/02015* (2013.01); *H03H 9/02157* (2013.01); *H03H 9/17* (2013.01)

(58) Field of Classification Search
CPC ...... H03H 9/131; H03H 9/17; H03H 9/02157; H03H 9/02015; H03H 9/105; H03H 9/1014

USPC .................. 333/133, 186, 187, 193–196
See application file for complete search history.

(56) References Cited

U.S. PATENT DOCUMENTS

| 5,538,920 | A | 7/1996 | Wakabayashi |
| 2004/0130034 | A1 | 7/2004 | Alvarez |
| 2006/0131998 | A1 | 6/2006 | Aoki et al. |
| 2013/0038408 | A1* | 2/2013 | Burak ............... H03H 9/02118 333/187 |
| 2017/0077900 | A1* | 3/2017 | Park ..................... H03H 9/0504 |
| 2017/0244379 | A1 | 8/2017 | Yang et al. |
| 2019/0044497 | A1 | 2/2019 | Fukuda |

FOREIGN PATENT DOCUMENTS

| JP | 2006-197554 A | 7/2006 |
| KR | 10-2017-0097366 A | 8/2017 |
| KR | 10-2018-0116407 A | 10/2018 |

* cited by examiner

*Primary Examiner* — Rakesh B Patel
*Assistant Examiner* — Jorge L Salazar, Jr.
(74) *Attorney, Agent, or Firm* — NSIP Law (57) ABSTRACT

A bulk-acoustic wave resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a connection member connected an upper surface of the metal pad. A lower end portion of the connection member includes a tapered portion decreasing in a diameter in a direction toward a lower end of the connection member, and an angle between an inclined surface of the tapered portion and the upper surface of the metal pad is 45° to 80°.

15 Claims, 4 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2020-0042080 filed on Apr. 7, 2020 in the Korean Intellectual Property Office, the entire disclosure of which is incorporated herein by reference for all purposes.

BACKGROUND

1. Field

The following description relates to a bulk-acoustic wave resonator.

2. Description of Related Art

A copper pillar (Cu pillar) technology used in flip chip mounting is a commonly used technology. However, Cu pillar technology is difficult to apply to a mounting process of a bulk-acoustic wave (BAW) volume acoustic resonator including an air cavity, for example. This is because the mounting process must be performed without causing damage to the air cavity. Accordingly, a structural development is desired to facilitate the application of Cu pillar technology to a BAW.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a connection member connected an upper surface of the metal pad. A lower end portion of the connection member includes a tapered portion decreasing in a diameter in a direction toward a lower end of the connection member, and an angle between an inclined surface of the tapered portion and the upper surface of the metal pad is 45° to 80°.

An upper end portion of the connection member may include a cylindrical portion having a constant diameter. The tapered portion may be disposed below the cylindrical portion.

The tapered portion may have a height of 6 μm or more.

A diameter of a bottom surface of the tapered portion may be 60 μm or more.

The connection member may be made of any one of gold (Au), a gold-tin (Au—Sn) alloy, copper (Cu), a copper-tin (Cu—Sn) alloy, and aluminum (Al), and an aluminum alloy, or a material containing any two or more of gold (Au), a gold-tin (Au—Sn) alloy, copper (Cu), a copper-tin (Cu—Sn) alloy and aluminum (Al), and an aluminum alloy.

The bulk-acoustic wave resonator may further include an insertion layer disposed between the first electrode and the piezoelectric layer.

The bulk-acoustic wave resonator may further include a membrane layer forming a cavity together with the substrate.

The bulk-acoustic wave resonator may further include: an etch stop portion disposed to surround the cavity; and a sacrificial layer disposed to surround the etch stop portion.

The membrane layer may include an inclined portion disposed obliquely with respect to an upper surface of the substrate, and a flat portion disposed in an active region in which the first electrode, the piezoelectric layer, and the second electrode all overlap one another.

The second electrode may include a frame disposed at an edge of the active region. The frame may have a thickness greater than a thickness of a remainder of the second electrode.

The bulk-acoustic wave resonator may further include an insulating layer disposed on the substrate, below the cavity.

The metal pad may include a first metal pad connected to the first electrode, and a second metal pad connected to the second electrode.

In another general aspect, a bulk-acoustic wave resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a connection member connected to an upper surface of the metal pad. The connection member includes: a cylindrical portion disposed at an upper end portion of the connection member and having a constant diameter; and a tapered portion disposed below the cylindrical portion, the tapered portion having a height of 6 μm or more and a diameter that is smaller at a lower end of the tapered portion than an upper end of the tapered portion.

A bottom surface of the tapered portion may be in contact with the upper surface of the metal pad.

A diameter of the bottom surface of the tapered portion may be 60 μm or more.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
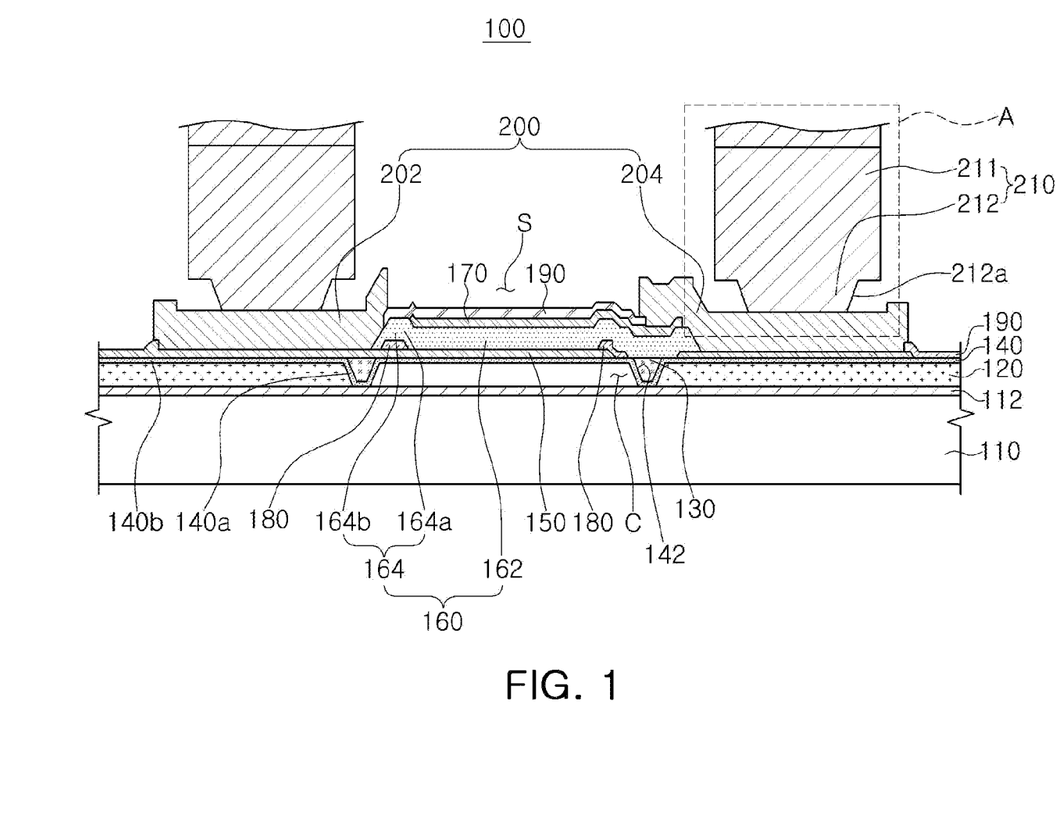
FIG. 1 is a schematic cross-sectional view illustrating a bulk-acoustic wave resonator, according to an embodiment.
Figure 2:
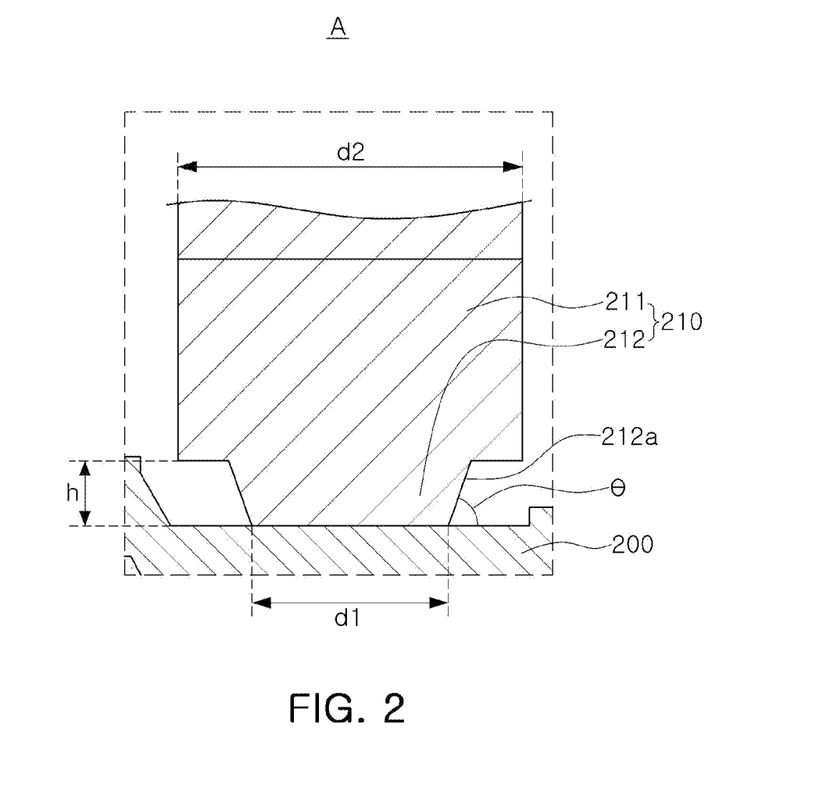
FIG. 2 is an enlarged view illustrating part A of FIG. 1.

FIG. 1 is a schematic cross-sectional view illustrating a bulk-acoustic wave resonator 100, according to an embodiment. FIG. 2 is an enlarged view illustrating part A of FIG. 1.

Referring to FIGS. 1 and 2, the bulk-acoustic wave resonator 100 may include, for example, a substrate 110, a sacrificial layer 120, an etch stop portion 130, a membrane layer 140, a first electrode 150, a piezoelectric layer 160, a second electrode 170, an insertion layer 180, a passivation layer 190, a metal pad 200, and a connection member 210.

The substrate 110 may be a silicon substrate. For example, a silicon wafer or a silicon-on-insulator (SOI) type substrate may be used as the substrate 110.

An insulating layer 112 may be disposed on an upper surface of the substrate 110, and may electrically isolate the substrate 110 from layers and components disposed thereon. In addition, the insulating layer 112 prevents the substrate 110 from being etched by an etching gas when a cavity C is formed in a manufacturing process.

In an example, the insulating layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

The sacrificial layer 120 may be formed on the insulating layer 112, and the cavity C and the etch stop portion 130 may be disposed in the sacrificial layer 120. The cavity C may be formed by removing a portion of the sacrificial layer 120 during manufacturing. As such, because the cavity C is formed in the sacrificial layer 120, a portion of the first electrode 150, and portions of other layers, disposed on an upper portion of the sacrificial layer 120 may be formed to be flat.

The etch stop portion 130 is disposed along a boundary of the cavity C. The etch stop portion 130 is provided to prevent etching from being performed beyond a cavity region in a process of forming the cavity C.

The membrane layer 140 forms a cavity C together with the substrate 110. In addition, the membrane layer 140 may be made of a material having low reactivity with the etching gas when removing the sacrificial layer 120. The etch stop portion 130 is inserted into and disposed in a groove portion 142 formed by the membrane layer 140. The membrane layer 140 may include an inclined portion 140a disposed obliquely with respect to the upper surface of the substrate 110, and a flat portion 140b disposed in an active region S in which the first electrode 150, the piezoelectric layer 160, and the second electrode 170 all overlap one another. The membrane layer 140 may include a dielectric layer including any one of silicon nitride ($Si_3N_4$), silicon oxide ($SiO_2$), manganese oxide (MgO), zirconium oxide ($ZrO_2$), aluminum nitride (AlN), lead acid lithium titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown) made of aluminum nitride (AlN), for example, may be formed on the membrane layer 140. That is, the seed layer may be disposed between the membrane layer 140 and the first electrode 150. The seed layer may be formed of a dielectric or metal having an HCP crystal structure in addition to aluminum nitride (AlN). In an example in which the seed layer is formed of a metal, the seed layer may be formed of titanium (Ti).

The first electrode 150 is formed on the membrane layer 140, and a portion of the first electrode 150 is disposed on an upper portion of the cavity C. In addition, the first electrode 150 may be configured as either one of an input electrode and an output electrode for inputting or outputting, respectively, an electrical signal such as a radio frequency (RF) signal, or the like.

The first electrode 150 may be made of, for example, an aluminum alloy material containing scandium (Sc). In an example in which the first electrode 150 is made of an aluminum alloy material containing scandium (Sc), since mechanical strength is increased, high power reactive sputtering may be possible. Under such deposition conditions, an increase in surface roughness of the first electrode 150 can be prevented, and a high orientation growth of the piezoelectric layer 160 can also be induced.

In addition, by containing scandium (Sc), chemical resistance of the first electrode 150 may be increased, thereby compensating for a disadvantage that occurs when the first electrode is made of pure aluminum. Furthermore, it is possible to ensure process stability in a dry etching or a wet etching process, for example, during manufacturing. Furthermore, oxidation occurs easily when a first electrode is made of pure aluminum, but the chemical resistance to oxidation can be improved by forming the first electrode 150 with an aluminum alloy material containing scandium.

However, the disclosure is not limited to the examples described above, and the first electrode 150 may be formed of a conductive material such as molybdenum (Mo) or an alloy of molybdenum (Mo). Additionally, for example, the first electrode 150 may be formed of a conductive material such as ruthenium (Ru), tungsten (W), iridium (Ir), platinum (Pt), copper (Cu), titanium (Ti), tantalum (Ta), nickel (Nickel: Ni), chromium (Cr), or the like, or an alloy of ruthenium (Ru), tungsten (W), iridium (Ir), platinum (Pt), copper (Cu), titanium (Ti), tantalum (Ta), nickel (Nickel: Ni), or chromium (Cr).

The piezoelectric layer 160 may be formed to cover at least the portion of the first electrode 150 disposed on the upper portion of the cavity C. The piezoelectric layer 160 is a portion configured to generate a piezoelectric effect that converts electrical energy into mechanical energy in a form of elastic waves, and includes, for example, an aluminum nitride (AlN) material.

In addition, dopants such as a rare earth metal or a transition metal may be doped into the piezoelectric layer 160. As an example, the rare earth metal used as a dopant may include any one or any combination of any two or more of scandium (Sc), erbium (Er), yttrium (Y), and lanthanum (La). Furthermore, the transition metal used as a dopant may include any one or any combination of any two or more of titanium (Ti), zirconium (Zr), hafnium (Hf), tantalum (Ta), and niobium (Nb). In addition, the piezoelectric layer 160 may also include magnesium (Mg), which is a divalent metal.

The second electrode 170 is formed to cover at least a portion of the piezoelectric layer 160 disposed on an upper portion the cavity C. The second electrode 170 may be configured as either one of an input electrode and an output electrode for inputting or outputting, respectively, an electrical signal such as a radio frequency (RF) signal. That is, when the first electrode 150 is configured as the input electrode, the second electrode 170 is configured as the output electrode, and when the first electrode 150 is configured as the output electrode, the second electrode 170 is configured as the input electrode.

However, the disclosure is not limited to the examples provided above, and the second electrode 170 may be formed of a conductive material such as molybdenum (Mo) or an alloy of molybdenum (Mo). Additionally, the second electrode 170 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

The insertion layer 180 is disposed between the first electrode 150 and the piezoelectric layer 160. The insertion layer 180 may be formed of a dielectric layer including silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), and gallium Arsenic (GaAs), hafnium oxide ($HfO_2$), aluminum oxide ($Al_2O_3$), titanium oxide ($TiO_2$), zinc oxide (ZnO), or the like, but may be formed of a material different from that of the piezoelectric layer 160. In addition, if necessary, it is also possible to form a region in which the insertion layer 180 is provided as an air space. The air space can be implemented by removing the insertion layer 180 in the manufacturing process.

As an example, the insertion layer 180 may be disposed along the surface of the membrane layer 140, the first electrode 150, and the etch stop portion 130. At least a portion of the insertion layer 180 may be disposed between the piezoelectric layer 160 and the first electrode 150.

The passivation layer 190 is formed in a region excluding portions of the first electrode 150 and the second electrode 170. The passivation layer 190 prevents the second electrode 170 and the first electrode 150 from being damaged during the manufacturing process.

Furthermore, a portion of the passivation layer 190 may be removed by etching to adjust a frequency characteristic in a final process. That is, the thickness of the passivation layer 190 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead titanate (PZT), gallium arsenide (GaAs), hafnium oxide ($HfO_2$), aluminum oxide ($Al_2O_3$), titanium oxide ($TiO_2$), and zinc oxide (ZnO) may be used to form the passivation layer 190, for example.

The metal pad 200 is formed on areas of the first electrode 150 and the second electrode 160 on which the passivation layer is not formed. As an example, the metal pad 200 may be made of a material such as gold (Au), a gold-tin (Au—Sn) alloy, copper (Cu), a copper-tin (Cu—Sn) alloy and aluminum (Al), an aluminum alloy, or the like. For example, the aluminum alloy may be an aluminum-germanium (Al—Ge) alloy.

The metal pad 200 may include a first metal pad 202 connected to the first electrode 150 and a second meal pad 204 connected to the second electrode 170.

The connection member 210 is connected to the metal pad 200, and a diameter of an upper end portion of the connection member 210 is larger than a diameter of a lower end portion of the connection member 210. As an example, the connection member 210 may include a cylindrical portion 211 disposed at an upper end portion of the connection member 210 and having a constant diameter, and a tapered portion 212 extending from the cylindrical portion 211, at a lower end portion of the connection member 210, and having a diameter that decreases in a direction toward a lower end of the connection member 210. An angle θ between an inclined surface 212a of the tapered portion 212 and the metal pad 200 may be 45 to 80°. Furthermore, a height h of the tapered portion 212 may be 6 μm or more. In addition, a minimum diameter d1 of the tapered portion 212 (e.g., at a bottom end/surface of the tapered portion 212) may be 60 μm or more. A maximum diameter d2 of the connection member 210 (e.g., in the cylindrical portion 211) may be 90 μm or more.

In a manufacturing method of the connection member 210, first, a protective photoresist is laminated on the metal pad 200, and then a seed layer is laminated on the photoresist. Thereafter, a plating photoresist for forming the connection member 210 is laminated and a hole for forming the connection member 210 is formed in the plating photoresist. Thereafter, after forming the connection member 210, the plating photoresist and the seed layer are removed. Thereafter, the tapered portion 212 is formed at a lower end portion of the connection member 210 by removing the protective photoresist.

Thus, the tapered portion 212 is formed at the lower end portion of the connection member 210 by removing the protective resist. Accordingly, the tapered portion 212 is formed to have a height (h) of 6 μm or more, and the angle θ between the inclined surface 212a of the tapered portion 212 and the metal pad 200 is 45 to 80°.

As an example, the connection member 210 may be made of a material such as gold (Au), a gold-tin (Au—Sn) alloy, copper (Cu), a copper-tin (Cu—Sn) alloy and aluminum (Al), an aluminum alloy, or the like. The connection member 210 may be made of the same material as that of the metal pad 200, or may be made of a material different from that of the metal pad 200. As an example, in an example in which the metal pad 200 is made of a gold (Au) material, the connection member 210 may be made of a copper (Cu) material.

As described above, since the tapered portion 212 is provided in the connection member 210, a stress applied to the lower portion of the connection member 210 may be reduced to improve reliability.

Furthermore, it is possible to easily connect the connection pad 210 to the metal pad 200, even if a region of the metal pad 200 is not sufficient for the installation of the connection member 210, by reducing the diameter of the lower end portion of the connection member 210 connected to the metal pad 200 and increasing the diameter of the upper end portion of the connection member 210.

Figure 3:
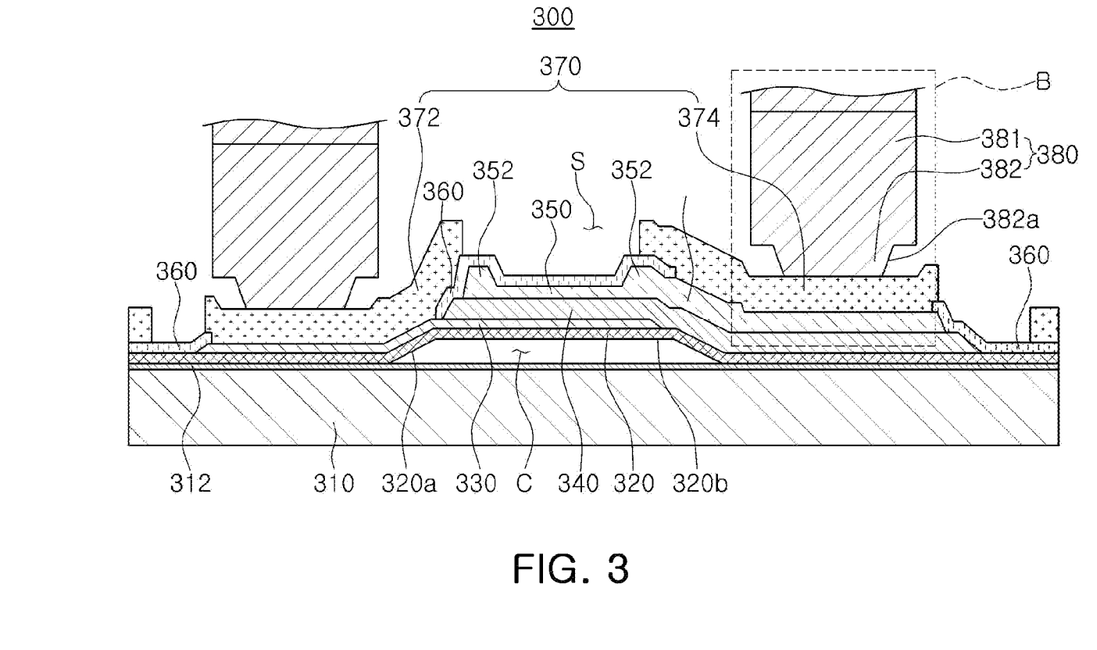
FIG. 3 is a schematic cross-sectional view illustrating a bulk-acoustic wave resonator, according to an embodiment.
Figure 4:
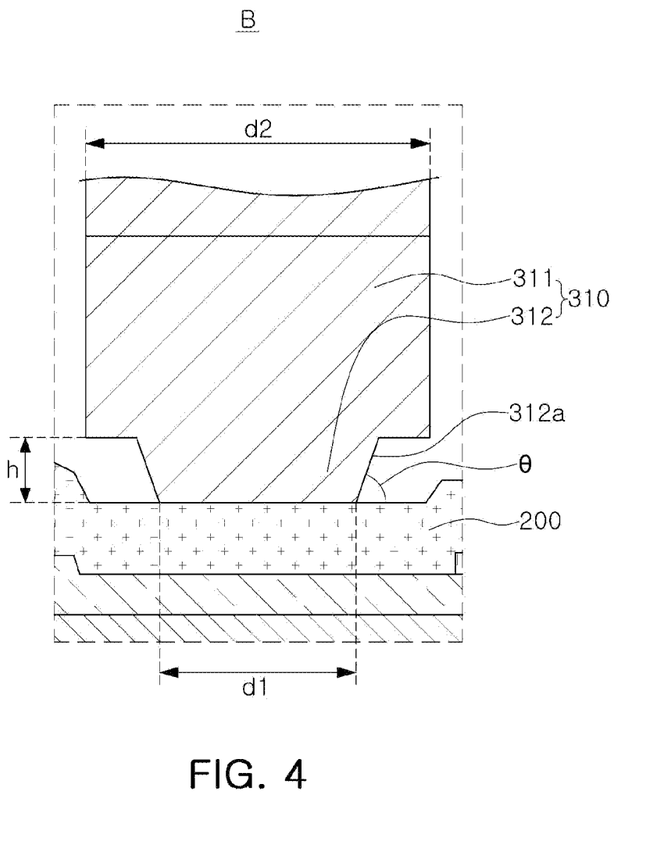
FIG. 4 is an enlarged view illustrating part B of FIG. 3.

FIG. 3 is a cross-sectional view illustrating a bulk-acoustic wave resonator 300, according to an embodiment. FIG. 4 is an enlarged view illustrating part B of FIG. 3.

Referring to FIGS. 3 and 4, the bulk-acoustic wave resonator 300 may include, for example, a substrate 310, a membrane layer 320, a first electrode 330, a piezoelectric layer 340, a second electrode 350, a passivation layer 360, a metal pad 370, and a connection member 380.

The substrate 310 may be a silicon substrate. For example, a silicon wafer or a silicon-on-insulator type substrate may be used as the substrate 310.

An insulating layer 312 may be formed on an upper surface of the substrate 310, and may electrically isolate the substrate 310 from the layers and components disposed thereon. In addition, the insulating layer 312 prevents the substrate 310 from being etched by an etching gas when a cavity C is formed in a manufacturing process.

In an example, the insulating layer 312 may be formed of any one or any combination of any two or more of silicon dioxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

The membrane layer 320 forms a cavity C together with the substrate 310. The membrane layer 320 may include an inclined portion 320a disposed obliquely with respect to an upper surface of the substrate 310, and a flat portion 320b disposed in an active region S in which the first electrode 330, the piezoelectric layer 340, and the second electrode 350 all overlap one another. In addition, the membrane layer 320 may be made of a material having low reactivity with the etching gas when removing the sacrificial layer (not shown). The membrane layer 320 may include a dielectric layer including any one of silicon nitride ($Si_3N_4$), silicon oxide ($SiO_2$), manganese oxide (MgO), zirconium oxide ($ZrO_2$), aluminum nitride (AlN), lead acid lithium titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown) made of aluminum nitride (AlN) may be formed on the membrane layer 320. That is, the seed layer may be disposed between the membrane layer 320 and the first electrode 330. The seed layer may be formed using a dielectric or metal having an HCP crystal structure in addition to aluminum nitride (AlN). In an example in which the seed layer is a metal, the seed layer may be formed of titanium (Ti).

The first electrode 330 may be disposed on the membrane layer 320, and a portion of the first electrode 330 may be disposed on an upper portion of the cavity C. In addition, the first electrode 330 may be configured as either one of an input electrode and an output electrode for inputting or outputting, respectively, an electrical signal such as a radio frequency (RF) signal, or the like.

As an example, the first electrode 330 may be formed of a conductive material such as molybdenum (Mo) or an alloy molybdenum (Mo). However, the disclosure is not limited to this example, and the first electrode 330 may be formed of a conductive material such as ruthenium (Ru), tungsten (W), iridium (Ir), platinum (Pt), copper (Cu), titanium (Ti), tantalum (Ta), nickel (Nickel: Ni), chromium (Cr), or the like, or an alloy of ruthenium (Ru), tungsten (W), iridium (Ir), platinum (Pt), copper (Cu), titanium (Ti), tantalum (Ta), nickel (Nickel: Ni), or chromium (Cr).

The piezoelectric layer 340 may be formed to cover at least the portion of the first electrode 330 disposed on an upper portion of the cavity C. The piezoelectric layer 340 is a portion configured to generate a piezoelectric effect that converts electrical energy into mechanical energy in a form of elastic waves, and may be formed of any one of aluminum nitride (AlN), zinc oxide (ZnO), and lead zirconium titanium oxide (PZT; PbZrTiO). For example, when the piezoelectric layer 340 is made of aluminum nitride (AlN), the piezoelectric layer 340 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). In addition, magnesium (Mg), which is a divalent metal, may also be included.

The second electrode 350 is formed to cover at least a portion of the piezoelectric layer 340 disposed on an upper portion of the cavity C. The second electrode 350 may be configured as either one of an input electrode and an output electrode for inputting and outputting, respectively, an electrical signal such as a radio frequency (RF) signal. That is, when the first electrode 330 is configured as the input electrode, the second electrode 350 may be configured as the output electrode, and when the first electrode 330 is configured as the output electrode, the second electrode 350 may be configured as the input electrode.

As an example, the second electrode 350 may be formed of a conductive material such as molybdenum (Mo) or an alloy of molybdenum (Mo). However, the disclosure is not limited to this example, and the first electrode 150 may be made of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy of ruthenium (Ru), tungsten (W), iridium (Ir), platinum (Pt), copper (Cu), titanium (Ti), tantalum (Ta), nickel (Ni), or chromium (Cr).

The second electrode 350 may include a frame 352 disposed at an edge of the active region S. As indicated above, the active region S is, for example, a region in which the first electrode 330, the piezoelectric layer 340, and the second electrode 350 all overlap one another. The frame 352 may have a thickness greater than a thickness of a remainder of the second electrode 350.

The passivation layer 360 is formed in a region excluding portions of the first electrode 330 and the second electrode 350. The passivation layer 360 prevents the second electrode 350 and the first electrode 330 from being damaged during a manufacturing process.

Furthermore, a portion of the passivation layer 360 may be removed by etching to adjust a frequency characteristic in a final process of the manufacturing process. That is, the thickness of the passivation layer 360 may be adjusted. The passivation layer 360 may be formed of a dielectric layer containing any one of silicon nitride ($Si_3N_4$), silicon oxide ($SiO_2$), magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), for example.

The metal pad 370 is connected to areas of the first electrode 330 and the second electrode 350 exposed from the passivation layer 360. As an example, the metal pad 370 may be made of a material such as gold (Au), a gold-tin (Au—Sn) alloy, copper (Cu), a copper-tin (Cu—Sn) alloy and aluminum (Al), an aluminum alloy, or the like. For example, the aluminum alloy may be an aluminum-germanium (Al—Ge) alloy.

The metal pad 370 may include a first metal pad 372 connected to the first electrode 330 and a second metal pad 374 connected to the second electrode 350.

The connection member 380 is connected to the metal pad 370, and a diameter of an upper end portion of the connection member 380 is larger than a diameter of a lower end portion of the connection member 380. As an example, the connection member 380 may include a cylindrical portion 381 disposed at an upper end portion of the connection member 380 and having a constant diameter, and a tapered portion 382 extending from the cylindrical portion 381, at a lower end portion of the connection member 380, and having a diameter that decreases in a direction toward a lower end of the connection member 210. An angle θ between the inclined surface 382*a* of the tapered portion 382 and the metal pad 380 may be 45 to 80°. Furthermore, a height (h) of the tapered portion 382 may be 6 μm or more. In addition, a minimum diameter (d1) of the tapered portion 382 (e.g., at a bottom end/surface of the tapered portion 382) may be 60 μm or more. A maximum diameter (d2) of the connection member 380 (e.g., in the cylindrical portion 211) may be 90 μm or more.

Hereinafter, a manufacturing method of the connection member 380 will be briefly discussed. First, a protective photoresist is laminated on the metal pad 370, and then a seed layer is laminated on the photoresist. Thereafter, a plating photoresist for forming the connection member 380 is laminated, and a hole for forming the connection member 380 is formed in the plating photoresist. Thereafter, after forming the connection member 380, the plating photoresist and the seed layer are removed. Thereafter, the tapered portion 382 is formed at the lower end portion of the connection member 380 by removing the protective photoresist.

Thus, the tapered portion 382 is formed at the lower end portion of the connection member 380 by removing the protective resist. Accordingly, the tapered portion 382 is formed to have a height (h) of 6 μm or more, and an angle θ between the inclined surface 382*a* of the tapered portion 382 and the metal pad 370 is 45 to 80 degrees.

As an example, the connection member 380 may be made of a material such as gold (Au), a gold-tin (Au—Sn) alloy, copper (Cu), a copper-tin (Cu—Sn) alloy and aluminum (Al), an aluminum alloy, or the like. The connection member 210 may be made of the same material as that of the metal pad 200 or may be made of a material different from that of the metal pad 200. In an example in which the metal pad 200 is made of a gold (Au) material, the connection member 210 may be made of a copper (Cu) material.

As described above, since the tapered portion 382 is provided in the connection member 380, a stress applied to the lower portion of the connection member 380 can be reduced to improve reliability.

Furthermore, even if an area of the connection pad 370 is not sufficient for the installation of the connection member 380, the connection member 380 may be easily connected to the metal pad 370 by reducing the diameter of the lower end portion of the connection member 380 connected to the metal pad 370 and increasing the diameter of the upper end portion of the connection member 380.

As set forth above, according to the embodiments disclosed herein, reliability of a bulk acoustic wave resonator may be improved by reducing the stress applied to a lower portion of a connection member.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate;
a first electrode disposed on the substrate;
a piezoelectric layer disposed to cover at least a portion of the first electrode;
a second electrode disposed to cover at least a portion of the piezoelectric layer;
a metal pad connected to the first electrode and the second electrode; and
a connection member connected an upper surface of the metal pad,
wherein an upper end portion of the connection member includes a cylindrical portion having a constant diameter,
wherein a lower end portion of the connection member includes a tapered portion disposed below the cylindrical portion and decreasing in a diameter in a direction toward the lower end of the connection member,
wherein an angle between an inclined surface of the tapered portion and the upper surface of the metal pad is 45° to 80°, and
wherein a diameter of a bottom surface of the tapered portion is 60 μm or more.

2. A bulk-acoustic wave resonator, comprising:
a substrate;
a first electrode disposed on the substrate;
a piezoelectric layer disposed to cover at least a portion of the first electrode;
a second electrode disposed to cover at least a portion of the piezoelectric layer;
a metal pad connected to the first electrode and the second electrode; and
a connection member connected an upper surface of the metal pad,
wherein a lower end portion of the connection member includes a tapered portion decreasing in a diameter in a direction toward the lower end of the connection member, the tapered portion has a height of 6 μm or more, and an angle between an inclined surface of the tapered portion and the upper surface of the metal pad is 45° to 80°.

3. The bulk-acoustic wave resonator of claim 2, wherein an upper end portion of the connection member includes a cylindrical portion having a constant diameter, and wherein the tapered portion is disposed below the cylindrical portion.

4. The bulk-acoustic wave resonator of claim 3, wherein a diameter of a bottom surface of the tapered portion is 60 μm or more.

5. The bulk-acoustic wave resonator of claim 2, wherein the connection member is made of any one of gold (Au), a gold-tin (Au—Sn) alloy, copper (Cu), a copper-tin (Cu—Sn) alloy, and aluminum (Al), and an aluminum alloy, or a material containing any two or more of gold (Au), a gold-tin (Au—Sn) alloy, copper (Cu), a copper-tin (Cu—Sn) alloy and aluminum (Al), and an aluminum alloy.

6. The bulk-acoustic wave resonator of claim 2, further comprising an insertion layer disposed between the first electrode and the piezoelectric layer.

7. The bulk-acoustic wave resonator of claim 2, further comprising a membrane layer forming a cavity together with the substrate.

8. The bulk-acoustic wave resonator of claim 7, further comprising:
an etch stop portion disposed to surround the cavity; and
a sacrificial layer disposed to surround the etch stop portion.

9. The bulk-acoustic wave resonator of claim 7, wherein the membrane layer comprises an inclined portion disposed obliquely with respect to an upper surface of the substrate, and a flat portion disposed in an active region in which the first electrode, the piezoelectric layer, and the second electrode all overlap one another.

10. The bulk-acoustic wave resonator of claim 9, wherein the second electrode includes a frame disposed at an edge of the active region, and wherein the frame has a thickness greater than a thickness of a remainder of the second electrode.

11. The bulk-acoustic wave resonator of claim 7, further comprising an insulating layer disposed on the substrate, below the cavity.

12. The bulk-acoustic wave resonator of claim 2, wherein the metal pad comprises a first metal pad connected to the first electrode, and a second metal pad connected to the second electrode.

13. A bulk-acoustic wave resonator, comprising:
a substrate;
a first electrode disposed on the substrate;
a piezoelectric layer disposed to cover at least a portion of the first electrode;
a second electrode disposed to cover at least a portion of the piezoelectric layer;
a metal pad connected to the first electrode and the second electrode; and
a connection member connected to an upper surface of the metal pad,
wherein the connection member comprises:
a cylindrical portion disposed at an upper end portion of the connection member and having a constant diameter; and
a tapered portion disposed below the cylindrical portion, the tapered portion having a height of 6 μm or more and a diameter that is smaller at a lower end of the tapered portion than an upper end of the tapered portion.

14. The bulk acoustic wave resonator of claim 13, wherein a bottom surface of the tapered portion is in contact with the upper surface of the metal pad.

15. The bulk acoustic wave resonator of claim 14, wherein a diameter of the bottom surface of the tapered portion is 60 μm or more.

* * * * *